(12) United States Patent
Ridley

(10) Patent No.: US 7,851,244 B2
(45) Date of Patent: Dec. 14, 2010

(54) METHODS FOR FORMING METAL LAYERS FOR A MEMS DEVICE INTEGRATED CIRCUIT

(75) Inventor: Jeff A. Ridley, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 146 days.

(21) Appl. No.: 12/029,433

(22) Filed: Feb. 11, 2008

(65) Prior Publication Data

US 2009/0200619 A1    Aug. 13, 2009

(51) Int. Cl.
*H01L 21/00* (2006.01)
*H01L 21/44* (2006.01)

(52) U.S. Cl. .................. 438/48; 438/670; 438/671; 438/951; 257/414; 257/E21.025; 257/E21.034; 257/E21.235

(58) Field of Classification Search .................. 438/48, 438/55, 670, 717, 736, 951; 257/414, 734, 257/E21.025, E21.034, E21.235, E21.587
See application file for complete search history.

(56) References Cited

U.S. PATENT DOCUMENTS 7,381,583 B1 * 6/2008 Ebel et al. ...................... 438/53
2007/0069320 A1 * 3/2007 Lee et al. ...................... 257/459

* cited by examiner

*Primary Examiner*—Hsien-ming Lee
(74) *Attorney, Agent, or Firm*—Fogg & Powers LLC

(57) ABSTRACT

Systems and methods for MEMS device fabrication. A layer of photoresist is formed on a substrate. A first region of the substrate is exposed to a radiation source through a photomask. The first region of exposed photoresist is developed with a developer solution in order to etch the exposed regions to a first depth. A second region is exposed to radiation through a second photomask. The second photomask defines areas in which a bump feature is intended on the substrate. The second region is developed with the developer solution, preparing the first and second exposed regions for a layer of metal. A layer of metal is deposited on the substrate, such that the metal attaches to both the substrate and any remaining photoresist on the substrate. The remaining photoresist and its attached metal is dissolved away leaving an interconnect pattern and at least one bump feature.

5 Claims, 4 Drawing Sheets

METHODS FOR FORMING METAL LAYERS FOR A MEMS DEVICE INTEGRATED CIRCUIT

BACKGROUND OF THE INVENTION

Micro-Electro-Mechanical Systems "MEMS" devices typically have moving parts, and may require some form of anti-stiction feature to limit the ability of the moving part to stick to the substrate once it is free to move. One method to do this is to create small features that stick up from the substrate and limit the ability of the moving part to contact the substrate to only these areas. This can greatly reduce the forces that would cause the moving part to stick, eg. when the device is being dried after immersion in liquid during fabrication. One example of these anti-stiction features are metal pads or "bumps" used in creating a MEMS Gyro. These bumps are typically placed on top of another metal feature that is used for device interconnect and capacitive read out. These bumps can also be used to enhance electrical contact to the moving parts.

One method to create the metal features is to use image reversal photolithography, metal deposition and lift-off. This sequence can be repeated as many times as is required to create the desired structures. When using image reversal photolithography the patterned photoresist layer created by this method cannot be altered by using a second exposure in subsequent steps. Image reversal is desirable because it can create a profile in the resist pattern that aids in lift-off. The image reversal steps are much longer than a standard photolithography step, so an alternative process to reduce cycle time would also be desirable.

FIG. 2 shows a cross section of a current MEMS device integrated circuit. The device 22 consists of a substrate 28, a first metal 26 and an applied bump metal 24. In this example photoresist is applied to the substrate 28, then exposed and developed. The first metal 26 is then deposited and lifted off creating a substrate 28 with a first metal 26. The bumps 24 are added by applying a photoresist, exposing and developing the region of the bumps. The metal is then deposited and lifted off to create the bumps. There are two distinct metallization steps resulting in a first layer of metal 26 and a second layer of the metal, the bump metal 24.

SUMMARY OF THE INVENTION

The present invention uses two photomasks and a singled deposition and lift off step to fabricate a Micro-Electro-Mechanical Systems "MEMS" device integrated circuit. A layer of photoresist is formed on a substrate. A first region of the substrate is exposed to a radiation source through a photomask. The first region of exposed photoresist is developed with a developer solution in order to etch the exposed regions to a first depth. A second region is exposed to radiation through a second photomask. The second photomask defines areas in which a bump feature is intended on the substrate. The second region is developed with the developer solution, preparing the first and second exposed regions for a layer of metal. A layer of metal is deposited on the substrate, such that the metal attaches to both the substrate and any remaining photoresist on the substrate. The remaining photoresist and its attached metal is etched away leaving an interconnect pattern and at least one bump feature.

As will be readily appreciated from the foregoing summary, the invention provides an improved process for fabricating a MEMS device integrated circuit.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
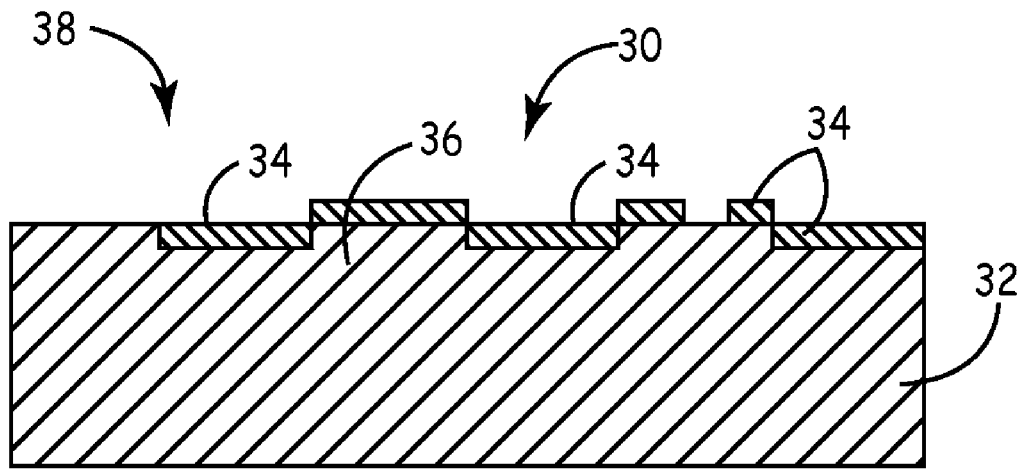
FIG. 1 shows a cross section of a fabricated Micro-Electro-Mechanical Systems "MEMS" device.
Figure 2:
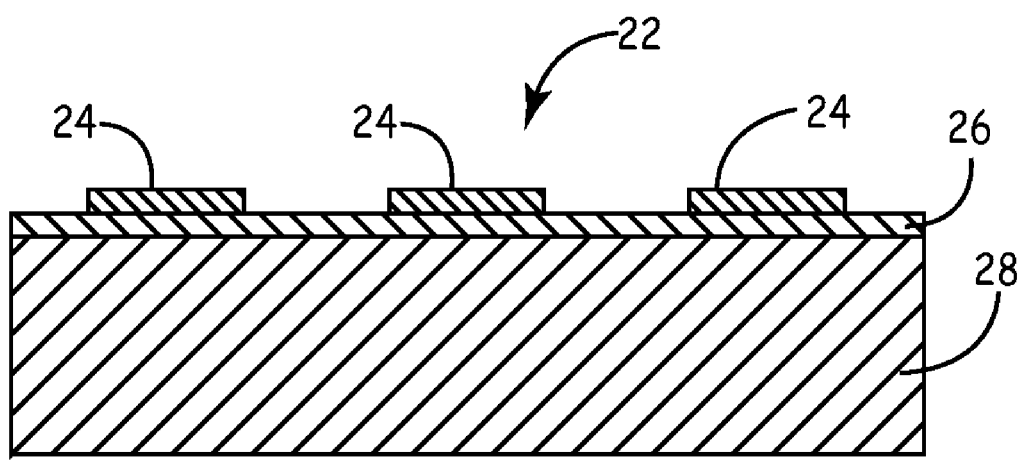
FIG. 2 shows a cross section of a MEMS device currently being used.
Figure 3:
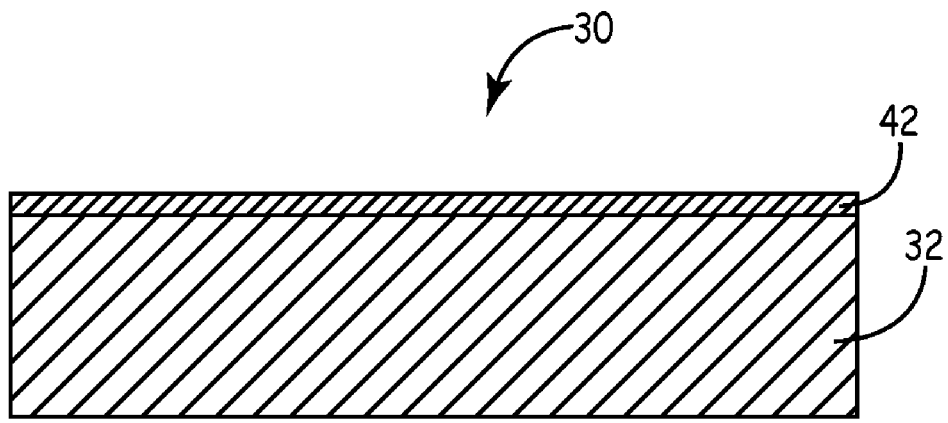
FIGS. 3-5 show multiple cross sections of a MEMS device during the fabrication process.
Figure 4:
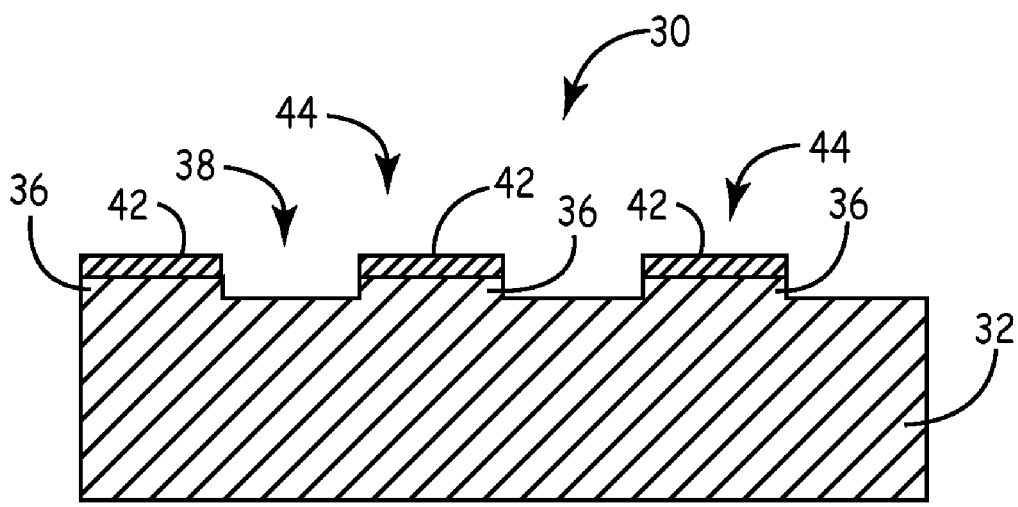

FIG. 1 shows a cross section of a Micro-Electro-Mechanical Systems "MEMS" device 30 fabricated by a method in accordance with an embodiment of the present invention. In one embodiment, the MEMS Device (e.g. accelerometer, temperature or pressure sensor, etc.) 30 includes a substrate 32, a metal layer 34, and a predefined pattern of metal bumps 36. In order to fabricate the device 30, a series of fabrication steps are used. First, the substrate 32 is coated with positive acting photoresist 42 that is compatible with a lift-off metallization process; this process is shown in FIG. 3. One such product now available is SIPR 9864M from Shin Etsu™. A region of the substrate 32 is exposed, using a photomask, to radiant light capable of reacting with the positive-acting photoresist 42 on the substrate 32. Once exposed, a developer is applied to the substrate 32, resulting in the exposed photoresist 42 being developed away. The exposed areas of the substrate 32 are preferably etched to a depth equal to the size of the bumps 36 desired. A second region of the remaining photoresist, using a second photomask, is exposed to the radiant light and is developed; this process is shown in FIG. 4. A metal layer 34 is formed on the substrate 32. The metal layer 34 attaches to both developed areas and areas still having photoresist 42. The remaining photoresist 42 is dissolved away and the metal 34 deposited on the photoresist 42 is lifted off, resulting in both a series of bumps 36 and an interconnect pattern for an integrated circuit.

FIG. 3 is a cross section showing the coating of positive photoresist 42 on the substrate 32. In one embodiment a glass substrate is used to form the base of the MEMS device 30. The positive acting photoresist layer 42 is applied to the substrate 32. The positive acting photoresist 42 is preferably compatible with a lift off of metal. The photoresist 42 being capable of withstanding normal processing temperatures and does not act as a source of contamination.

FIG. 4 shows a cross section of the bumps 36 on the substrate 32. A predefined photomask (not shown) is configured to expose a region of the substrate 32 to a radiation source. The photomask allows light to touch those areas that define the bumps 36 and that will be etched to accept a metal. Once the area 44 is exposed, a developer solution is applied to the photoresist 42 to develop away the exposed regions 44. The exposed and developed regions are etched to a depth equal to the height of the bumps 36. The etching process is conducted in a light that does not possess a wavelength capable of developing other areas of photoresist 42 still present on the substrate 32.

Figure 5:
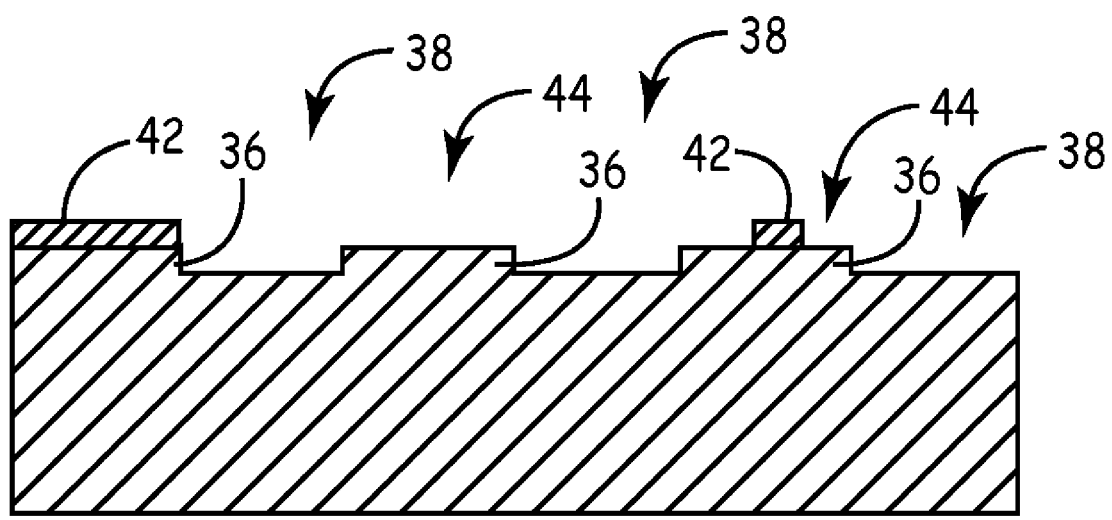

Once the etching process has been completed, a second photomask is applied. The photomask is designed to allow light radiation to expose only the bumps 36, having photoresist 42. The exposed bumps 44, are subjected to a developer solution leaving a raised bump portion 36 and an etched recess 38. The substrate 32 still having areas covered with photoresist 42 to define an interconnect pattern, this process is shown in FIG. 5.

Figure 5A:
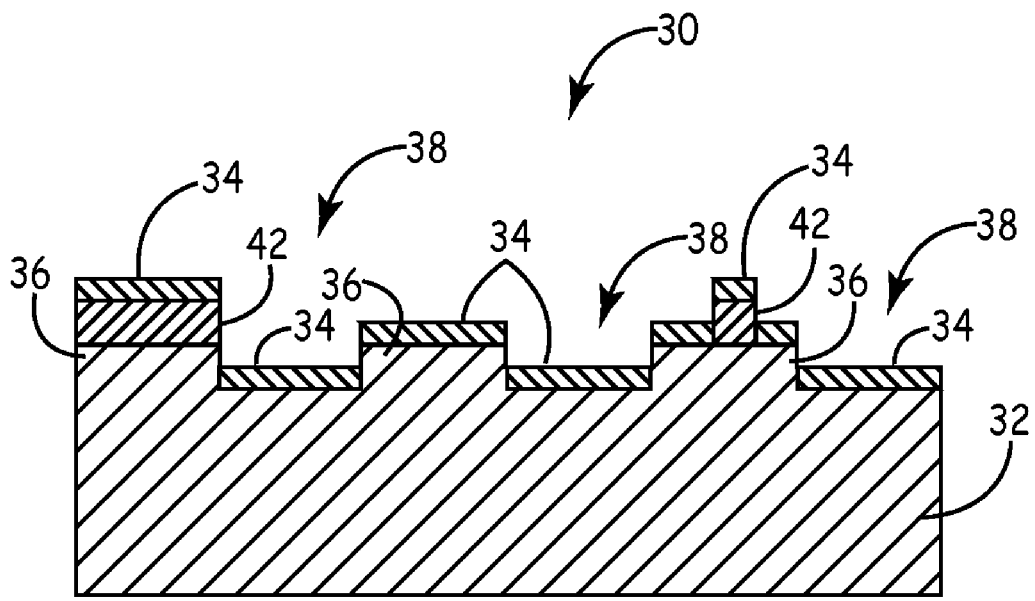
Figure 5B:
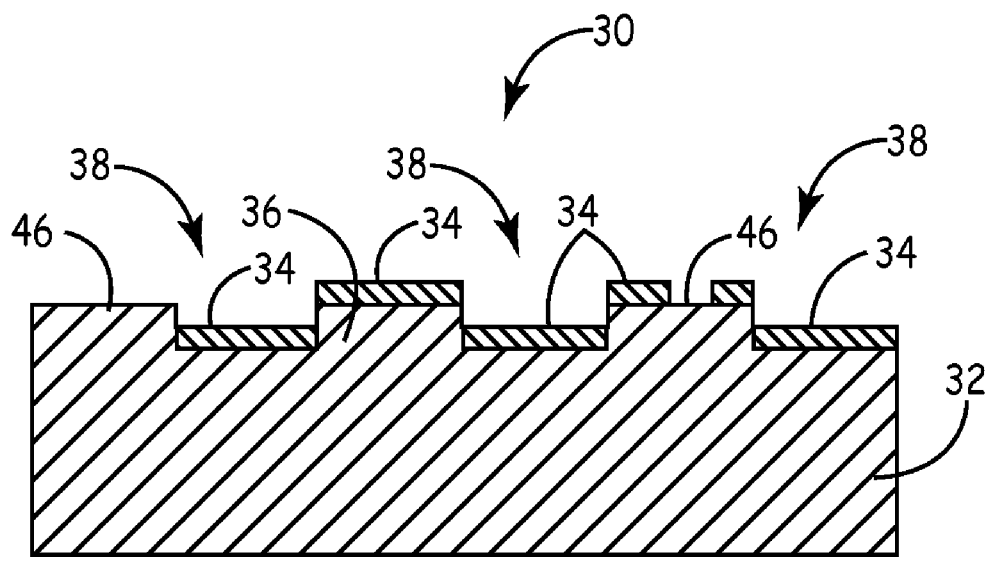

FIGS. 5A-5B show a cross section of a lift off step in one embodiment of the present invention. A layer of metal is applied to the substrate 32. The metal layer 34 attaching to all developed areas and also attached to any remaining photoresist 42. The remaining photoresist 42 is dissolved away lifting off any metal 34 attached to it, leaving a recess portion 38 covered with metal 34, a bump portion 36 covered with metal 34 and an area 46 without any metal attached to the substrate 32. The areas with no metal generally define an interconnect pattern for the MEMS device.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for forming metal layers for a MEMS device integrated circuit comprising:
   removing a first region of photoresist that is coating a wafer and is exposed to a radiation source;
   etching a substrate of the wafer to a first depth equal to a height of at least one bump feature;
   removing a second region of the photoresist that is coating the wafer and is exposed to the radiation source, wherein the photoresist removed in the second region is portions of the photoresist remaining after removal of the first region of the photoresist;
   depositing a metal onto the wafer, wherein the metal attaches to the substrate exposed by the removal of the first and second regions of the photoresist and to the photoresist remaining after the removal of the first and second regions of the photoresist; and
   lifting off the remaining photoresist covered with the deposited metal.

2. The method of claim 1, wherein etching the substrate further comprises:
   etching the substrate in an environment in which an ambient light does not possess a wavelength capable of developing other areas of the photoresist still present on the substrate after removing the first region of the photoresist.

3. The method of claim 1, wherein the wafer defines an interconnect pattern.

4. The method of claim 1, wherein the removing the first region of the photoresist coating the wafer comprises removing the first region of a positive-acting photoresist coating the wafer.

5. The method of claim 4, wherein the positive-acting photoresist is designed to be compatible with temperatures necessary for depositing the metal onto the wafer.

\* \* \* \* \*